United States Patent
Kimbrough et al.

(10) Patent No.: US 7,983,871 B2
(45) Date of Patent: Jul. 19, 2011

(54) METHOD AND APPARATUS FOR EMPLOYING PREVIOUS TEST INSERTION RESULTS FOR TESTING A DEVICE

(75) Inventors: Douglas C. Kimbrough, Austin, TX (US); Michael A. Retersdorf, Austin, TX (US); Kevin R. Lensing, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 179 days.

(21) Appl. No.: 11/849,735

(22) Filed: Sep. 4, 2007

(65) Prior Publication Data

US 2009/0058449 A1   Mar. 5, 2009

(51) Int. Cl.
*G01R 31/00* (2006.01)
(52) U.S. Cl. .................. 702/119; 702/123; 702/182
(58) Field of Classification Search .......... 702/119, 702/123, 182; 716/4, 5, 16, 17; 714/725–727
See application file for complete search history.

(56) References Cited

U.S. PATENT DOCUMENTS

| | | | | |
|---|---|---|---|---|
| 5,475,315 A * | 12/1995 | Cabot | | 324/628 |
| 6,202,186 B1 * | 3/2001 | Oonk | | 714/738 |
| 6,543,047 B1 * | 4/2003 | Vrhel et al. | | 717/121 |
| 6,704,676 B2 * | 3/2004 | Boldt | | 702/117 |
| 6,928,626 B1 * | 8/2005 | McGaughy et al. | | 716/1 |
| 7,139,956 B2 * | 11/2006 | Nozuyama | | 714/741 |
| 7,373,621 B1 * | 5/2008 | Dastidar | | 716/4 |

* cited by examiner

*Primary Examiner* — Mohamed Charioui
*Assistant Examiner* — Elias Desta
(74) *Attorney, Agent, or Firm* — Williams, Morgan & Amerson, P.C.

(57) ABSTRACT

A method includes determining at least a first characteristic of a device during a first test insertion and storing the first characteristic. The device is identified during a second test insertion. The first characteristic is retrieved responsive to the identification of the device. A test program for the second insertion is configured based on the first characteristic. The configured test program is executed to test the device during the second test insertion.

25 Claims, 2 Drawing Sheets

US 7,983,871 B2

METHOD AND APPARATUS FOR EMPLOYING PREVIOUS TEST INSERTION RESULTS FOR TESTING A DEVICE

CROSS-REFERENCE TO RELATED APPLICATIONS

Not applicable.

BACKGROUND OF THE INVENTION

The disclosed subject matter relates generally to manufacturing and, more particularly, to a method and apparatus for employing previous test insertion results for testing a device.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device.

After fabrication of the devices is complete, each wafer is subjected to preliminary functional tests, commonly referred to as final wafer electrical tests (FWET) that evaluate test structures on the wafer and SORT tests that evaluate each die. Wafers that pass these tests are then cut to singulate the individual die, which are then packed in substrates. Packed dies are then subjected to additional tests against the specification of customers' orders to determine performance characteristics such as maximum operating speed, power, caches, etc.

Exemplary tests include initial class tests (ICL) that is a preliminary test for power and speed. ICL testing is usually followed by burn-in (BI) and post burn-in (PBI) tests that test packaged die under specified temperature and/or voltage stress, and automatic test equipment (ATE) tests that test die functionality. Then, packaged dies with different characteristics go through system-level tests (SLT) in which they are tested against customer requirements on specific electrical characteristics. In SLT, packaged dies are tested in an actual motherboard by running system-level tests (e.g., variance test programs). After completion of the testing, the devices are fused, marked, and packed to fill customer orders. This back-end processing is commonly referred to as the test, mark, pack (TMP) process.

Typically, test instructions and acceptance criteria are defined for each test program implemented by a tester. These programs are typically stored in a central database and essentially static. A tester may periodically download the most current "golden" test program from a central data store prior to implementing the test. The recipe database allows revision and configuration control. However, the test program is executed without change once it is downloaded by the tester. Hence, the test flow and acceptance criteria employed by the tester are static.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF THE INVENTION

The following presents a simplified summary of the disclosed subject matter in order to provide a basic understanding of some aspects thereof. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes determining at least a first characteristic of a device during a first test insertion and storing the first characteristic. The device is identified during a second test insertion. The first characteristic is retrieved responsive to the identification of the device. A test program for the second insertion is configured based on the first characteristic. The configured test program is executed to test the device during the second test insertion.

Another aspect of the disclosed subject matter is seen in a system including first and second testers and a data store. The first tester is operable to determine at least a first characteristic of a device during a first test insertion. The data store is operable to store the first characteristic. The second tester is operable to identify the device during a second test insertion, retrieve the first characteristic responsive to the identification of the device, configure a test program for the second insertion based on the first characteristic, and execute the configured test program to test the device during the second test insertion.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
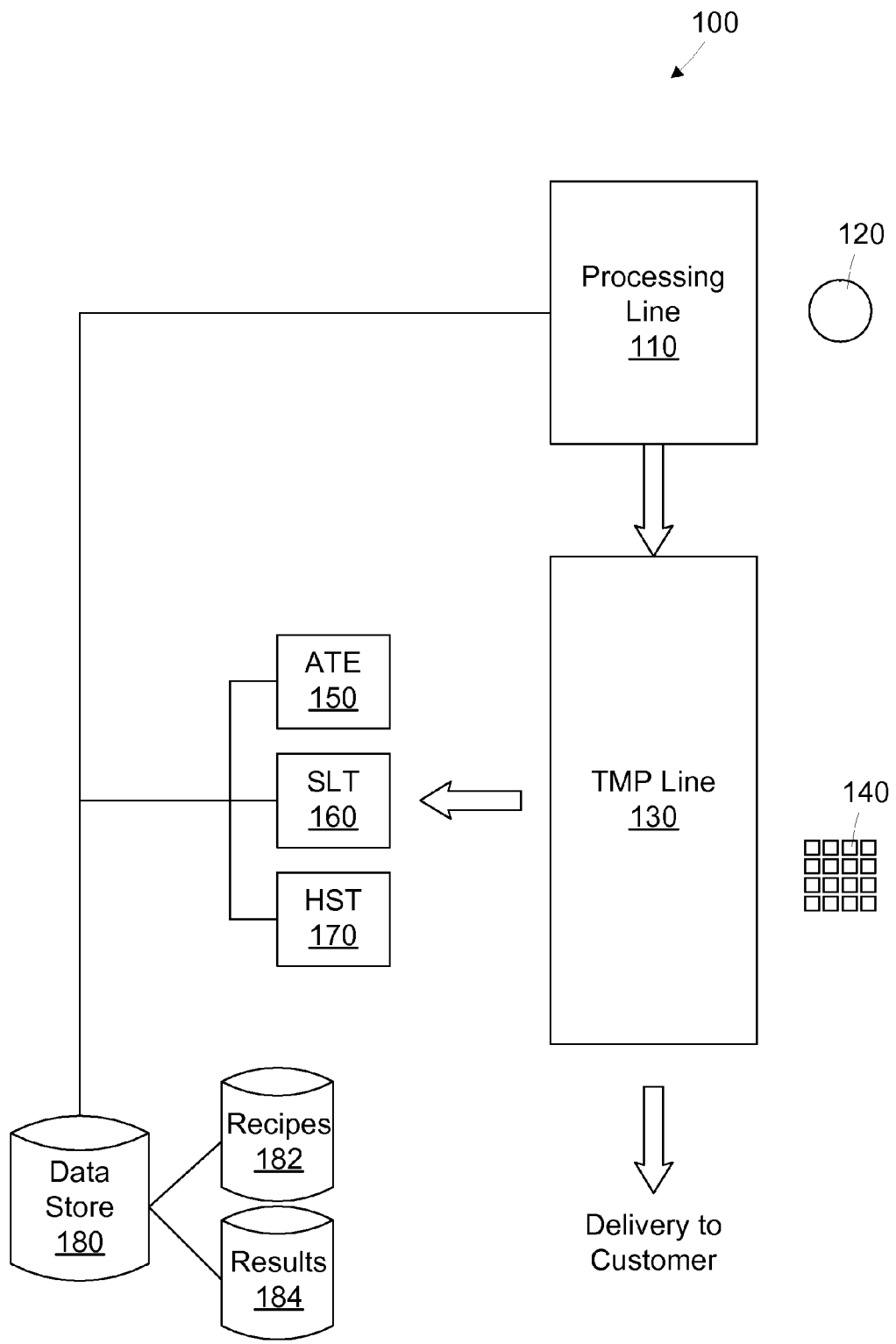
FIG. 1 is a simplified block diagram of a manufacturing system in accordance with one embodiment of the disclosed subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE INVENTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Referring now to the drawings wherein like reference numbers correspond to similar components throughout the several views and, specifically, referring to FIG. 1, the disclosed subject matter shall be described in the context of an illustrative manufacturing system 100. The manufacturing system 100 includes a processing line 110 for fabricating wafers 120, a test, mark, pack (TMP) line 130 for processing devices 140, an automated test equipment (ATE) tester 150, a system lever tester (ST) 160, a hybrid system tester (HST) 170, and a data store 180.

In the illustrated embodiment, wafers 120 are processed by the processing line 110 to fabricate die thereon. The processing line 110 may include a variety of process tools and/or metrology tools, which may be used to process and/or examine the wafers to fabricate the semiconductor devices. For example, the process tools may include photolithography steppers, etch tools, deposition tools, polishing tools, rapid thermal anneal tools, ion implantation tools, and the like. The process metrology tools may include thickness measurement tools, scatterometers, ellipsometers, scanning electron microscopes, and the like. Techniques for processing the wafers 120 are well known to persons of ordinary skill in the art and therefore will not be discussed in detail herein for clarity and to avoid obscuring the disclosed subject matter. Although a single wafer 120 is pictured in FIG. 1, it is to be understood that the wafer 120 is representative of a single wafer as well as a group of wafers, e.g. all or a portion of a wafer lot that may be processed in the processing line 110.

After the wafers 120 have been processed in the processing line 110 to fabricate the die, certain metrology tools, such as sort or final wafer electrical test (FWET) tools may be employed to collect electrical performance data while the wafer is still uncut. Sort metrology employs a series of probes to electrically contact pads on the completed die to perform electrical and functional tests. For example, a sort metrology tool may measure voltages and/or currents between various nodes and circuits that are formed on the wafer 120. Exemplary sort parameters measured include, but are not limited to, clock search parameters, diode characteristics, scan logic voltage, static $I_{DD}$, minimum $V_{DD}$, power supply open short characteristics, and ring oscillator frequency, etc. The particular sort parameters selected may vary depending on the application and the nature of the device formed on the die. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them.

After the die on the wafer 120 have completed preliminary testing, the wafers 120 are cut to singulate the die. Each die is then each mounted to a package, resulting in the devices 140. The test units 150, 160, 170 then subject the devices 140 to various testing programs to grade the devices and verify full functionality. Although only single testers 150, 160, 170 are illustrated, an actual implementation will involve multiple testers 150,160,170 of each type. In addition, a particular tester 150, 160, 170 may test multiple devices 140 in parallel.

Typically, ATE testers 150 are designed for high throughput, high accuracy testing. For example, an ATE tester 150 generally can run tests at different voltage levels with precise voltage control. The system level tester 160 is configured to test devices in an actual system environment, such as by booting an operating system. System level testers 160 do not exhibit the speed characteristics or the voltage control characteristics of ATE testers 150. Hybrid system testers 170 are configured to perform burn-in tests and system level tests.

The data store 180 houses information related to the testing of the devices 140 over the plurality of test program runs, or insertions. In the illustrated example, an ATE tester 150 performs initial testing of the devices 140 to establish power characteristics and the system level testers 160 and/or hybrid system testers 170 employ the determined power characteristics to control the program flow of the subsequent system level test insertions. Generally, this sharing process may be seen as importing information from a first insertion for controlling a second insertion. Although these multiple insertions are illustrated as being conducted on testers of different types (e.g., ATE and system level test), it is contemplated that data from a first insertion may be imported for use during a second insertion on the same type of tester.

In the illustrated embodiment, the power measurements determined by the ATE tester 150 during a first insertion include static $I_{DD}$, dynamic $I_{DD}$, minimum operating voltage (min $V_{DD}$), etc. The ATE tester 150 may retrieve a test program from a recipe database 182 included in the data store 180. The test program specifies the test protocol for determining the power characteristics of the device. The resulting power characteristics are stored in a results database 184 of the data store 180. The power characteristics provide information regarding the market segment for which the device may be suitable. Exemplary market segments include server, mobile, and desktop. Generally, devices with low power requirements are better suited for mobile applications, while those with higher power requirements are better suited for server or desktop applications. Differentiations between servers and desktops may be made on the basis of maximum frequency and/or process conditions. For example, devices which had some process faults during fabrication in the processing line 110 may be designated as being ineligible for server applications.

During a second insertion, a particular device 140 is inserted into a tester, such as the system level tester 160 or the hybrid system tester 170. This second insertion need not be sequential with respect to the first insertion. For example, intermediate insertions for purposes of burn-in or post burn-in testing may be conducted between the first power characterization insertion and the subsequent system level testing insertion. For purposes of the following example, it is assumed that the hybrid system tester 170 performs the second insertion. In preparing for the insertion, the hybrid system tester 170 may load a test program from the recipe database 182 for processing a particular lot of devices. In the illustrated embodiment, the same test program may be used all devices in the lot, so the program need only be loaded once. Subsequently, the hybrid system tester 170 identifies an inserted device 140 (e.g., using a bar code scanner or by reading an ID stored on the device). Upon identifying the inserted device, the hybrid system tester 170 accesses the results database 184 to retrieve data associated with the previous insertion, such as the power characteristics of the device.

The power characteristics of the device are employed by the hybrid system tester 170 for determining the particular test iterations to be performed and/or acceptance criteria to be employed. For example, if the power characteristics indicate that the device is suitable for a mobile application, a sub program associated with testing mobile devices may be implemented. However, if the power characteristics indicate that the device is suitable for a server application, a different sub-program may be implemented. The sub-program may have different acceptance criteria or test ranges depending on the application. As an alternative to using sub-programs, the same script may be followed, but the acceptance criteria may vary. In some cases, such as with servers that always undergo burn-in, the program may also define burn-in requirements. Other segments may undergo reduced burn-in (e.g., in terms of time or temperature) or may only undergo burn-in on a sampling basis. Those of ordinary skill in the art are familiar with the particular test program ranges and acceptance criteria useful for determining if a device meets requirements for a particular segment, so these program elements are not described in greater detail herein.

One output of the system level test performed during the subsequent insertion is the rated frequency of the device 140. The hybrid system tester 170 uses the power characteristics and tests the device 140 at various operating frequencies to determine the maximum rated frequency of the device. Because, the power characteristics are provided from the previous insertions, these parameters need not be retested during the system level testing, but rather only validated. The frequency results in combination with the power characteristics allow preliminary or final binning or market segmenting of the devices, depending on the stage of the testing flow. A market segment descriptor may be assigned to the device based on the determined power and speed characteristics.

Importing the results of a previous insertion simplifies the testing needed in the subsequent insertion and also increases flexibility. Devices in a lot need not be sorted based on power characteristics or preliminary market segment prior to running the system level tests to allow the selection of the appropriate test program. Instead, a single test program may be used that allows devices in a lot to be tested in any order by retrieving the appropriate power characteristics for each device and employing those characteristics to tailor the subsequent testing.

Figure 2:
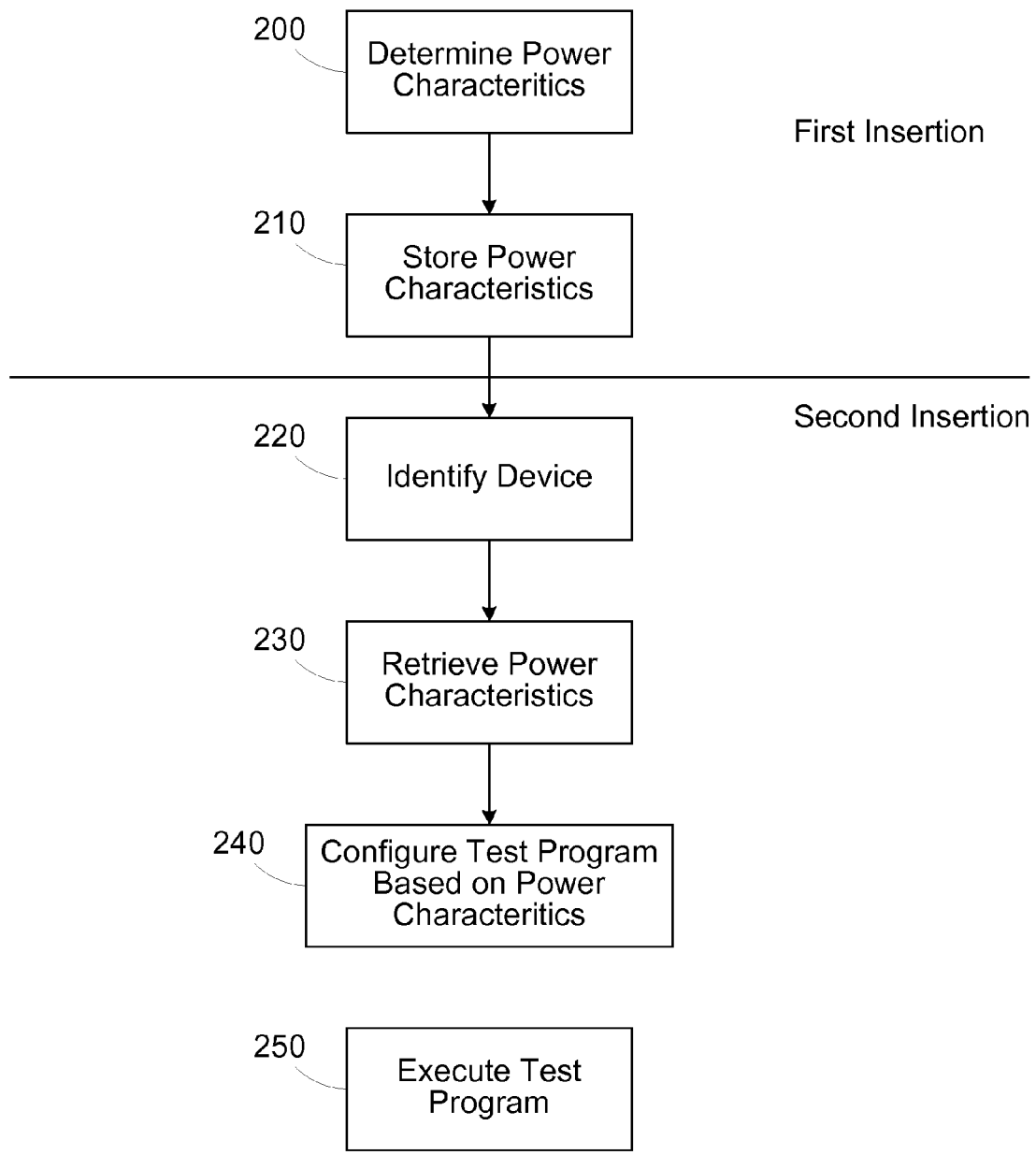
FIG. 2 is a simplified flow diagram of a method for employing previous test insertion results for testing a device in accordance with another illustrative embodiment of the disclosed subject matter.

Turning now to FIG. 2, a simplified flow diagram for testing devices is provided. In method block 200, a first test insertion of a device 140 is performed to determine power characteristics of the device. The power characteristics are stored in method block 210. In method block 220, the device is identified during a second insertion, and the power characteristics are retrieved in method block 230. The retrieved power characteristics are used for configuring the test program for the second insertion in method block 240. Configuring the test program could include determining a sub-program to run based on a market segment specified by the power characteristics. Configuring the test program could also include selecting acceptance criteria based on the power characteristics. The configured test program is executed in method block 250.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   measuring a value of at least a first characteristic of a device during a first test insertion;
   storing the measured value of the first characteristic;
   identifying the device during a second test insertion;
   retrieving the measured value of the first characteristic responsive to the identification of the device;
   configuring a test program for the second insertion based on the measured value of the first characteristic; and
   executing the configured test program to test the device during the second test insertion.

2. The method of claim 1, further comprising interfacing the device with an automatic test equipment tester for performing the first test insertion.

3. The method of claim 2, further comprising interfacing the device with one of a system level tester or a hybrid system tester for performing the second test insertion.

4. The method of claim 1, further comprising measuring a value of at least a second characteristic of the device during the second test insertion.

5. The method of claim 4, further comprising assigning a market segment descriptor to the device based on the measured values of the first and second characteristics.

6. The method of claim 1, wherein configuring the test program further comprises selecting a particular sub-program based on the measured value of the first characteristic.

7. The method of claim 1, wherein configuring the test program further comprises determining an acceptance criterion for the test program based on the measured value of the first characteristic.

8. A method, comprising:
   measuring a value of at least one power characteristic of a device during a first test insertion;
   storing measured value of the power characteristic;
   identifying the device during a second test insertion;
   retrieving the measured value of the power characteristic responsive to the identification of the device;
   configuring a test program for the second insertion based on the measured value of the power characteristic; and
   executing the configured test program to test the device during the second test insertion.

9. The method of claim 8, further comprising interfacing the device with an automatic test equipment tester for performing the first test insertion.

10. The method of claim 9, further comprising interfacing the device with one of a system level tester or a hybrid system tester for performing the second test insertion.

11. The method of claim 8, further comprising measuring a value of at least one speed characteristic of the device during the second test insertion.

12. The method of claim 11, further comprising assigning a market segment descriptor to the device based on the measured values of the power characteristic and the speed characteristic.

13. The method of claim 8, wherein the power characteristic comprises at least one of a static current parameter, a dynamic current parameter, or a minimum operating voltage.

14. The method of claim 8, wherein configuring the test program further comprises selecting a particular sub-program based on a measured value of the power characteristic.

15. The method of claim 8, wherein configuring the test program further comprises determining an acceptance criterion for the test program based on the measured value of the power characteristic.

16. A system, comprising:
   a first tester operable to measure a value of at least a first characteristic of a device during a first test insertion;
   a data store operable to store the measured value of the first characteristic;
   a second tester operable to identify the device during a second test insertion, retrieve the measured value of the first characteristic responsive to the identification of the device, configure a test program for the second insertion based on the measured value of the first characteristic, and execute the configured test program to test the device during the second test insertion.

17. The system of claim 16, wherein the first tester comprises an automatic test equipment tester.

18. The system of claim 17, wherein the second tester comprises one of a system level tester or a hybrid system tester.

19. The system of claim 16, wherein the second tester is further operable to measure a value of at least a second characteristic of the device during the second test insertion.

20. The system of claim 19, wherein the second tester is further operable to assign a market segment descriptor to the device based on the measured values of the first and second characteristics.

21. The system of claim 19, wherein the first characteristic comprises a power characteristic and the second characteristic comprises a speed characteristic.

22. The system of claim 16, wherein the first characteristic comprises a power characteristic.

23. The system of claim 22, wherein the power characteristic comprises at least one of a static current parameter, a dynamic current parameter, or a minimum operating voltage.

24. The system of claim 16 wherein the second tester is operable to configure the test program by selecting a particular sub-program based on the measured value of the first characteristic.

25. The system of claim 16, wherein the second tester is operable to determine an acceptance criterion for the test program based on the measured value of the first characteristic.

* * * * *